United States Patent
Suganuma

[11] Patent Number: 5,311,087
[45] Date of Patent: May 10, 1994

[54] NOISE REMOVING CIRCUIT

[75] Inventor: Hisashi Suganuma, Saitama, Japan

[73] Assignee: Pioneer Electronic Corporation, Tokyo, Japan

[21] Appl. No.: 911,578

[22] Filed: Jul. 10, 1992

[30] Foreign Application Priority Data

Jul. 12, 1991 [JP] Japan .................. 3-172707
Jul. 12, 1991 [JP] Japan .................. 3-172708

[51] Int. Cl.$^5$ ............................................ H03K 5/08
[52] U.S. Cl. ................................. 307/520; 307/353; 307/529; 328/151; 328/165
[58] Field of Search ............... 307/352, 353, 359, 542, 307/529, 520; 328/127, 151, 165, 55, 155, 162, 168

[56] References Cited

U.S. PATENT DOCUMENTS

| | | | |
|---|---|---|---|
| 3,792,195 | 2/1974 | Wilson et al. | 328/151 |
| 3,812,386 | 3/1974 | Porter | 307/353 |
| 4,282,515 | 8/1981 | Patterson, III | 307/352 |
| 4,334,195 | 6/1982 | Luce | 328/168 |
| 4,528,678 | 7/1985 | Udren | 375/104 |
| 4,574,390 | 3/1986 | Hirohashi et al. | 381/13 |
| 4,814,714 | 3/1989 | Beadle | 307/352 |
| 4,958,085 | 9/1990 | Hashimoto et al. | 328/155 |

FOREIGN PATENT DOCUMENTS 0099760 2/1984 European Pat. Off. .
2173075 10/1986 European Pat. Off. .

Primary Examiner—Timothy P. Calahan
Assistant Examiner—My Trang Ton
Attorney, Agent, or Firm—Sughrue, Mion, Zinn, Macpeak & Seas

[57] ABSTRACT

A noise removing circuit for removing an impulse noise in a signal. An input selector switch receives a first signal and a second signal to selectively output the first and second signals. A polyphase sampling pulse generator outputs polyphase pulse trains. A plurality of sample-and-hold circuits are in cascaded connection to sample and hold the output of the input selector switch. Each of the sample-and-hold circuits is activated by pulses of a corresponding phase of the polyphase pulse trains to sample and hold a signal level being held on a preceding circuit. Each of a plurality of multipliers has a predetermined multiplication coefficient and outputs the signal level on each of sample-and-hold circuits multiplied with said predetermined coefficient. An adder adds up the outputs of the plurality of multipliers to produce the second signal.

3 Claims, 6 Drawing Sheets

FIG. 5A INPUT
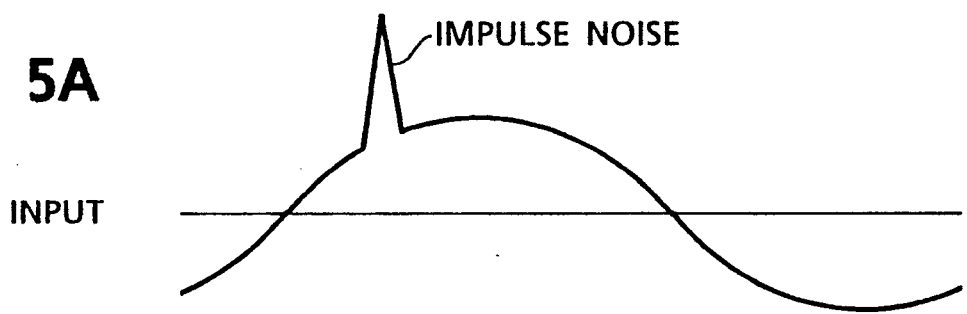
FIG. 5B SAMPLING PULSE
FIG. 5C
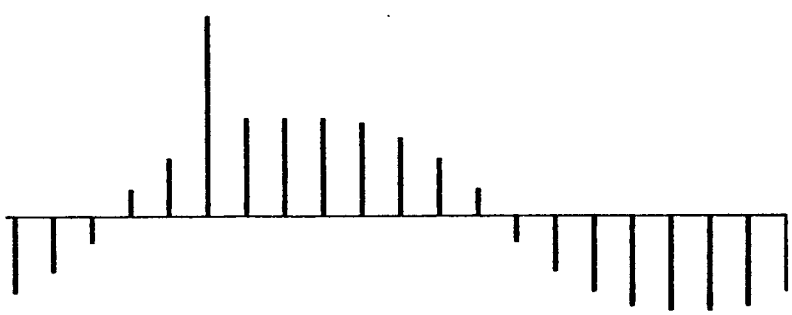
FIG. 5D SAMPLED & HELD SIGNAL
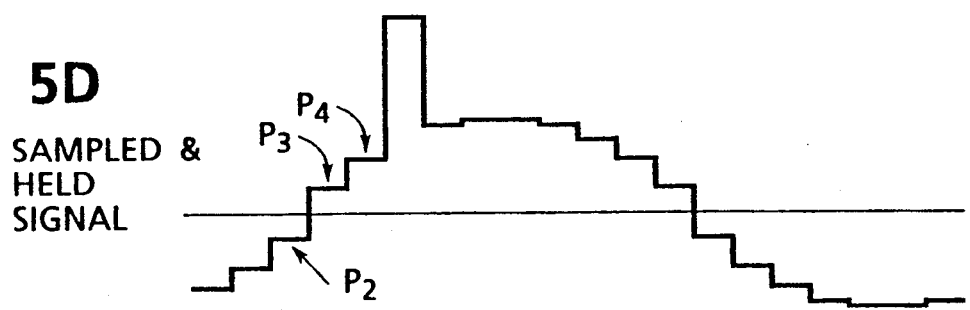
FIG. 5E OUTPUT
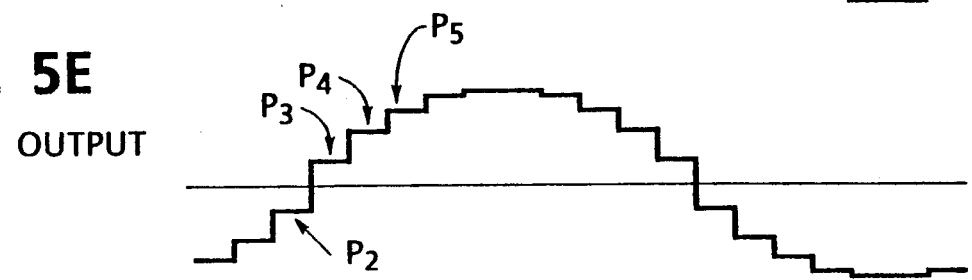
FIG. 5F OUTPUT OF FILTER

NOISE REMOVING CIRCUIT

BACKGROUND OF THE INVENTION

1. Field of the Invention

The invention relates to a noise removing circuit for removing impulse noise from a signal.

2. Prior Art

FIG. 7 shows a general construction of a prior art noise removing circuit for removing impulse noise from an input signal. In FIG. 7 when a noise detector 30 detects no impulse noise in an input signal, a switch 31 is closed so that the input signal is directed to an amplifier 33 which outputs an amplified signal. When the noise detector 30 detects an impulse noise in the input signal, the switch 31 is opened so that the voltage of input signal just before the switch 31 is opened is held across a capacitor 32. The amplifier 33 amplifies the voltage across the capacitor 32 and outputs the amplified voltage.

FIG. 6 shows the change in waveform of an input signal passing through the circuit in FIG. 7. As shown in FIG. 6, the prior art noise removing circuit is such that the voltage of the input signal just before an impulse noise is detected is held across a capacitor and is outputted during noise removing period. Thus, the output signal waveform is different from what would otherwise be present if impulse noise is not contained in the input signal. This causes the output signal to be distorted after impulse noise has been removed therefrom.

SUMMARY OF THE INVENTION

An object of the present invention is to provide a noise removing circuit where the signal level just before an impulse noise is detected is sampled and held so as to produce an output signal waveform with minimum distortion by extrapolating the waveform which would otherwise be present if the impulse noise is not present in the signal.

An input selector switch receives a signal from an external circuit and directs the signal to the first one of a plurality of cascaded sample-and-hold circuits. The first sample-and-hold circuit is activated by one phase (zero-phase)pulse) of a polyphase pulse train so as to sample and hold the input signal at a predetermined sampling rate. The following respective sample-and-hold circuits are sequentially activated by corresponding ones of the phases to transfer the sampled signal level to the next sample-and-hold circuit. By this operation, the signal levels at respective moments just before the impulse noise has been detected are held in the respective sample-and-hold circuits. The outputs of the sample-and-hold circuits are supplied to corresponding multipliers where the signal levels are multiplied with predetermined coefficients. Then, the outputs of the respective multipliers are directed to an adder where all the signal levels are added together.

When an impulse noise is detected, the input selector switch receives the output of the adder instead of the signal from the external circuit, and supplies it to the first sample-and-hold circuit. The signal waveform extrapolated in this manner closely resembles the signal waveform which would otherwise be present if impulse noise were not present in the signal.

The impulse noise removing circuit of the first embodiment is provided with a polyphase sampling pulse generator, which provides a plurality of phases of pulse trains from zero-phase to $\Delta Tn$-phase, each of which activates a corresponding sample-and-hold circuit sequentially so that the sampled signal levels are sequentially transferred from one circuit to the next.

The impulse noise removing circuit of the second embodiment is provided with a two-phase sampling pulse generator, which provides two pulse trains; one is a zero-phase pulse train for activating odd-stage sample-and-hold circuits and the other is a $\Delta T$-phase pulse train for activating even-stage sample-and-hold circuits. The odd-stage circuits are thus activated alternately with the even-stage circuits so that the sampled signal levels are sequentially transferred from one circuit to the next.

BRIEF DESCRIPTION OF THE DRAWINGS

Features and other objects of the invention will be more apparent from the detailed description of the preferred embodiments with reference to the accompanying drawings in which:

FIGS. 5A–5F show the waveforms of various stages of the noise removing circuit of the FIG. 1;

DETAILED DESCRIPTION OF THE PREFERRED EMBODIMENTS

Construction of First Embodiment

Figure 1:
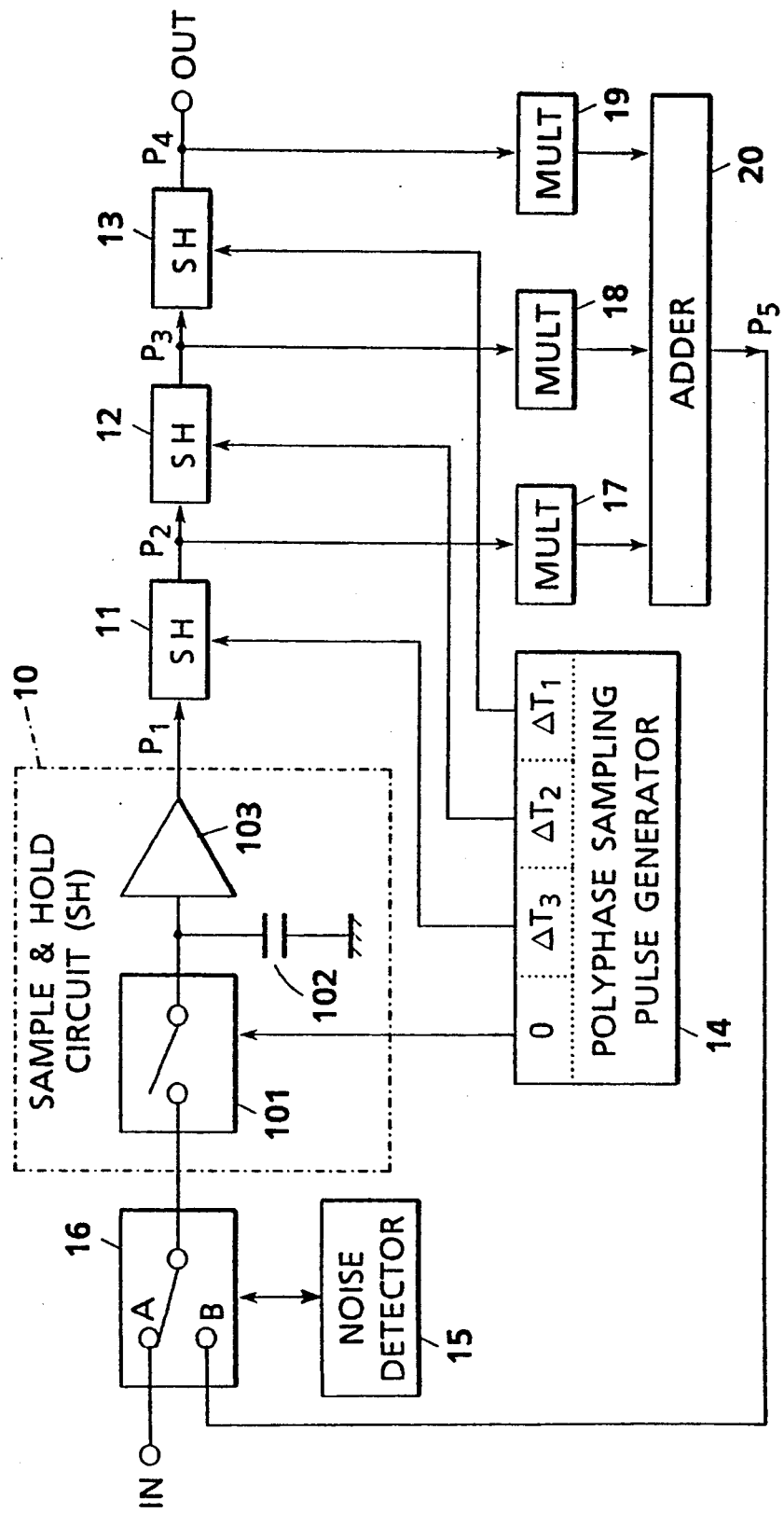
FIG. 1 shows a first embodiment of the invention illustrating four sample-and-hold circuits in cascaded configuration.
Figure 2:
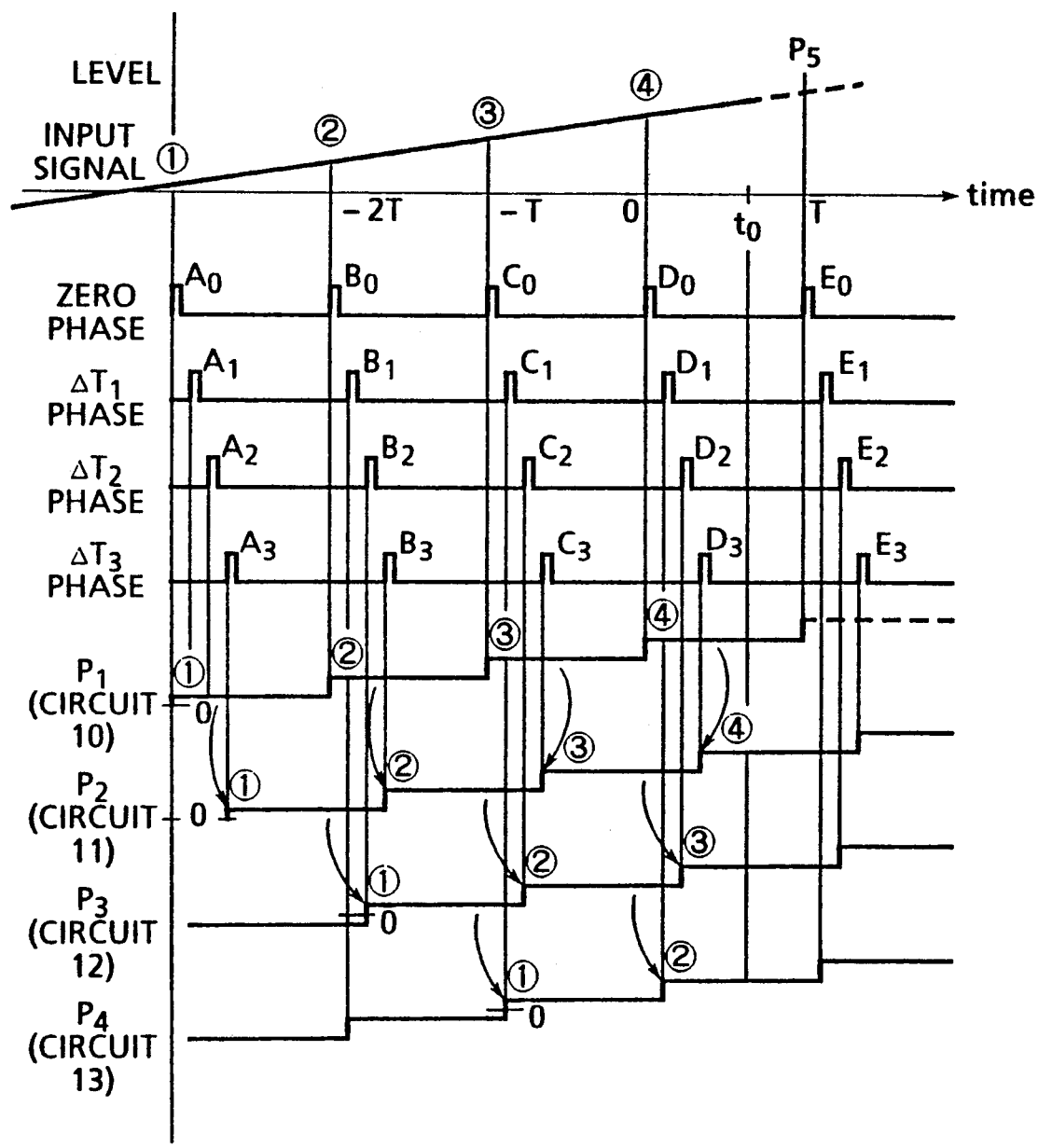
FIG. 2 is a timing chart of polyphase pulse trains used for noise removing circuit of FIG. 1.

A first embodiment is a noise removing circuit with $N (N \geq 3)$ sample-and-hold circuits in cascaded configuration. FIG. 1 shows the first embodiment illustrating four sample-and-hold circuits 10–13. In FIG. 1, as exemplified in a circuit 10, each of the circuits 10–13 has a switch 101, a capacitor 102, and a buffer amplifier 103. A polyphase sampling pulse generator 14 generates four phases of pulse trains (ZERO PHASE to $\Delta T1$–$\Delta T3$-PHASE) as shown in FIG. 2. The four phases have the same period of T and delay times of zero, $\Delta T1$, $\Delta T2$, and $\Delta T3$, respectively, where zero $< \Delta T1 < \Delta T2 < \Delta T3$, with respect to the first phase i.e., zero-phase. The pulse phases have a frequency higher than 2F where F is the maximum frequency of the input signal. The pulses of each phase are outputted to a sample-and-hold circuit corresponding to that phase such that the pulses are not overlapped in time with the pulses of other phases at any moment. When a noise detector 15 detects no impulse noise in an input signal, the noise detector 15 causes an input selector switch 16 to shift to position A. Each of multipliers 17–19 receives the signal level (P2–P4) from a corresponding sample-and-hold circuit and outputs to an adder 20 a signal multiplied with a predetermined coefficient. The adder adds up the outputs of the multipliers 17–19.

Strictly speaking, the output of the noise removing circuit in FIG. 1 is of a staircase step wave, but this may easily be removed by passing the output signal through a proper filter.

Operation of the First Embodiment

The operation of the first embodiment will now be described with reference to FIG. 2, which is a timing chart showing the timed relationship among an input signal, the polyphase pulse trains, and signal levels held on the sample-and-hold circuits 10–13. The switch 101 of the sample-and-hold circuit 10 opens only when the polyphase sampling pulse generator 14 outputs pulses, allowing the input signal level to be stored across the capacitor 102.

For simplicity, we assume that all the sample-and-hold circuits are initially empty and an input signal is of a first order function as shown in FIG. 2. Upon receiving pulse $A_0$ of the zero-phase, the switch 101 is opened so that the capacitor 102 stores the signal level just before the switch 101 becomes opened. Thus, sample-and-hold circuit 10 holds signal level 1 of the input signal. The sample-and-hold circuit 11 activated by pulse $A_3$ of the $\Delta T3$-phase in a manner similar to the sample-and-hold circuit 10, and holds the signal level 1 held on the sample-and-hold circuit 10.

Then, the sample-and-hold circuit 10 is activated by pulse $B_0$ to sample and hold signal level 2. The sample-and-hold circuit 12 is activated by pulse $B_2$ of the $\Delta T2$-phase such that the circuit 12 receives the signal 1 from the sample-and-hold circuit 11. Then, the sample-and-hold circuit 11 is activated by pulse $B_3$ of the $\Delta T3$-phase such that the circuit 11 receives the signal level 2 from the sample-and-hold circuit 10.

The sample-and-hold circuit 10 is then activated by pulse $C_0$ to sample and hold signal level 3. The sample-and-hold circuit 13 is activated by pulse $C_1$ of the $\Delta T1$-phase such that the circuit 13 receives the signal 1 from the sample-and-hold circuit 12. The sample-and-hold circuit 12 is activated by pulse $C_2$ of the $\Delta T2$-phase such that the circuit 12 receives the signal 2 from the sample-and-hold circuit 11. The sample-and-hold circuit 11 is activated by pulse $C_3$ of the $\Delta T3$-phase, and holds the signal level 3 held on the sample-and-hold circuit 10.

The sample-and-hold circuit 10 is activated by pulse $D_0$ to sample and hold signal level 4. The sample-and-hold circuit 13 is then activated by pulse $D_1$ of the $\Delta T1$-phase such that the circuit 13 receives the signal level 2 from the sample-and-hold circuit 12. The sample-and-hold circuit 12 is activated by pulse $D_2$ of the $\Delta T2$-phase such that the circuit 12 receives the signal 3 from the sample-and-hold circuit 11. The sample-and-hold circuit 11 is activated by pulse $D_3$ of the $\Delta T3$-phase, and holds the signal level 4 held on the sample-and-hold circuit 10.

By iterating the aforementioned operation, just before an impulse noise is detected at time $t = t_0$, the sample-and-hold circuit 11 holds the signal level (P2) sampled by the previously pulse ($D_0$) of zero-phase, the circuit 12 holds the signal level (P3) sampled two pulses before ($C_0$) and the circuit 13 holds the signal level (P4) sampled three pulses before ($B_0$).

The extrapolation of signal level in the first embodiment will now be described as follows:

We assume that an impulse noise is detected at time $t = t_0$, and the sample-and-hold circuits 11, 12, 13 hold signal levels just before the impulse has been detected i.e., P2, P3, and P4 sampled by the sample-and-hold circuit 10 at time $t = 0$, $t = -T$, and $t = -2T$, respectively.

Assuming that the signal level varies in amplitude with respect to a first order function, a signal level (P5) at $t = T$ is extrapolated by the following equation.

$$P5 = a \cdot t + b \quad (1)$$

Thus, we obtain $$P5 = 2P2 - P3 \quad (2)$$

Thus, the multiplier 17 is given a coefficient of 2 so as to output a signal level twice as large as the signal level held on the sample-and-hold circuit 11. The multiplier 18 is given a coefficient of $-1$ so as to output the signal level held on the sample-and-hold circuit 12 with a reversed polarity. The multiplier 19 is given a coefficient of 0(zero) so as to output the signal level held on the sample-and-hold circuit 11 with an infinitely large attenuation. The adder 20 adds up the outputs of the respective multipliers 17–19 to provide an extrapolated signal level P5 given by equation (2). The output P5 is received by the input selector switch 16. The value of P5 at a future time $t = T$ (after noise detection at time $t = t_0$) is based on the value P2 that occurred at time $t = -0$ and the value P3 that occurred at time $t = -T$. In other words, the signal levels in the past (before an impulse noise has been detected) are used to extrapolate a signal level in the future (after the noise has been detected).

Assumming that the input signal varies in amplitude with respect to a second order function, a signal level(P5) at $t = T$ is extrapolated by the following equation.

$$P5 = a \cdot t^2 + b \cdot t + c \quad (3)$$

Thus, we obtain the following relations.

$$\text{at } t = T, P5 = aT^2 + bT + c \quad (4)$$
$$\text{at } t = 0, P2 = c \quad (5)$$
$$\text{at } t = -T, P3 = a(-T)^2 + b(-T) + c = aT^2 - bT + c \quad (6)$$
$$\text{at } t = (-2T), P4 = a(-2T)^2 + b(-2T) + c = 4aT^2 - 2bT + c \quad (7)$$
$$\text{From Eq(6)} \times 2 - \text{Eq(7), we obtain } 2P3 - P4 = -2aT^2 + c \quad (8)$$
$$\text{Putting Eq(5) into Eq(8), we obtain } aT^2 = 1/2(P2 - 2P3 + P4) \quad (9)$$
$$\text{From Eq(6)} \times 4 - \text{Eq(7), we obtain } 4P3 - P4 = -2bT + 3c \quad (10)$$
$$\text{Putting Eq(5) into Eq(10), we obtain } bT = 1/2(3P2 - 4P3 + P4) \quad (11)$$

Putting Eqs(5), (9), and (11) into Eq(4), we obtain $$P5 = 1/2(P2 - 2P3 + P4) + 1/2(3P2 - 4P3 + P4) + P2 = 3P2 - 3P3 + P4 \quad (12)$$

Thus, the multipliers 17, 18, and 19 are given coefficients of 3, $-3$, and 1, respectively. The adder 20 adds up the outputs of the respective multipliers 17–19 to provide an extrapolated signal level P5 given by Eq(3). Since the selector switch is has shifted to position B after detection of noise, the output P5 is directed to the sample-and-hold circuit 10 just as in the case of the first order function.

The first embodiment has been described in terms of input signals of a first order and a second order, various ways of producing extrapolated signal levels may be possible by assigning the respective multipliers appropriate coefficients. Although the first embodiment has been described with respect to a four cascaded sample-and-hold circuits, three cascaded circuits are enough if only a first order extrapolation is needed. The number of cascaded circuits can be determined according to the accuracy of extrapolation required when the present invention is carried out. The more circuits employed, the higher order extrapolation is possible. The order of extrapolation i.e., first order, second order and so on, may be selected according to the desired accuracy of extrapolation when the present invention carried out. The higher the order is, the higher the noise reduction is.

FIGS. 5A–5F show the waveforms of various stages of the noise removing circuit of the present invention. FIG. 5A shows an input to the noise removing circuit with an impulse noise superimposed. FIG. 5B shows sampling pulses outputted from the polyphase sampling pulse generator 14. FIG. 5C shows a signal level sampled by the sample-and-hold circuit 10 assuming that the noise detector is not used i.e., the switch 16 remains at position A. FIG. 5D shows the signal of FIG. 5C held on the sample-and-hold circuit 10. FIG. 5E shows the output of the noise removing circuit of the sample-and-hold circuit 13. It should be noted that the abnormally high signal level due to the impulse noise is replaced by a signal level P5 extrapolated on the basis of the signal levels P2, P3, and P4 on sampled-and-hold circuits 11, 12, 13 just before the impulse noise is detected. FIG. 5F shows the waveform of FIG. 5E passed through an appropriate filter.

Construction of Second Embodiment

Figure 3:
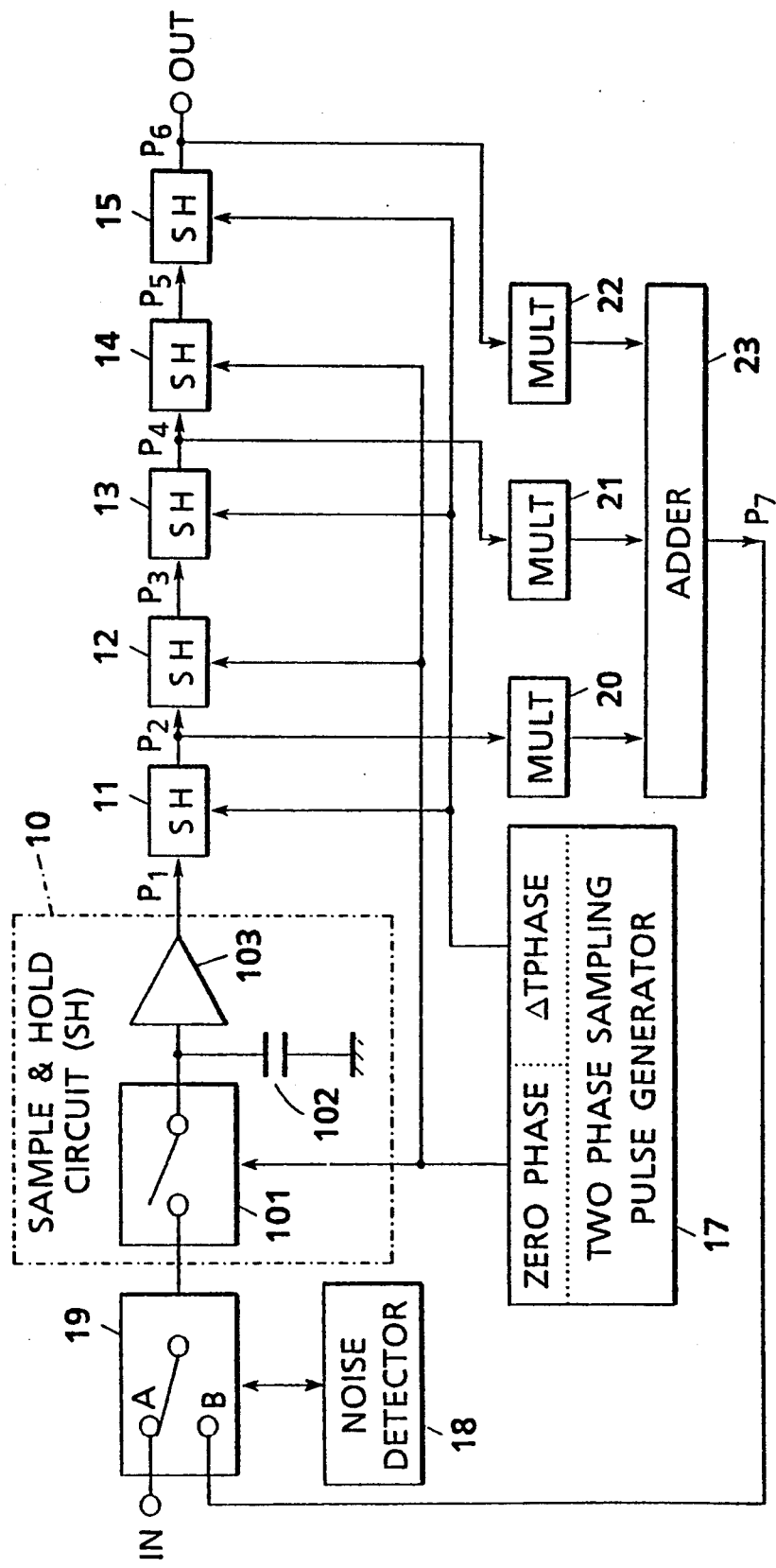
FIG. 3 shows a second embodiment of the invention illustrating six sample-and-hold circuits in cascaded configuration.

A second embodiment is a noise removing circuit with 2N (N≧) sample-and-hold circuits in a cascaded configuration. FIG. 3 shows the second embodiment illustrating six sample-and-hold circuits. In FIG. 3, as exemplified by the circuit 10, each of sample-and-hold circuits 10–13 has a switch 101, a capacitor 102, and a buffer amplifier 103. A two-phase sampling pulse generator 17 generates two-phase pulse trains each having the same period of T. One of the phases is a zero-phase pulse train and the other is a $\Delta T$-phase pulse train having a delay time of $\Delta T$ with respect to the zero-phase train so that the pulses are not overlapped in time with the pulses of the other phase at any moment. The zero-phase pulses are supplied to the odd-stage sample-and-hold circuits 10, 12, and 14 while the $\Delta T$-phase pulses are fed to the even-stage sample-and-hold circuits 11, 13, and 15. When a noise detector 18 detects no impulse noise in an input signal, the noise detector 18 causes an input selector switch 19 to shift to position A. When the noise detector 18 detects an impulse noise in the input signal, the noise detector 18 causes the input selector switch 19 to shift to position B to direct the output of an adder 23 to the sample-and-hold circuit 10. Each of multipliers 20–22 receives the output from a corresponding sample-and-hold circuit and outputs to the adder 23 a signal level multiplied with a predetermined coefficient. The adder 23 adds up the outputs of the multipliers 20–22 and outputs an extrapolated signal level during detection of impulse noise. Strictly speaking, the output of the noise removing circuit is of a staircase step wave, but this may easily be removed by passing the output through a proper filter.

Operation of the Second Embodiment

The operation of the second embodiment will now be described with reference to FIG. 4. The switch 101 of the sample-and-hold circuit 10 is opened only when the generator 17 outputs pulses, allowing the input signal level to be stored across the capacitor 102.

Figure 4:
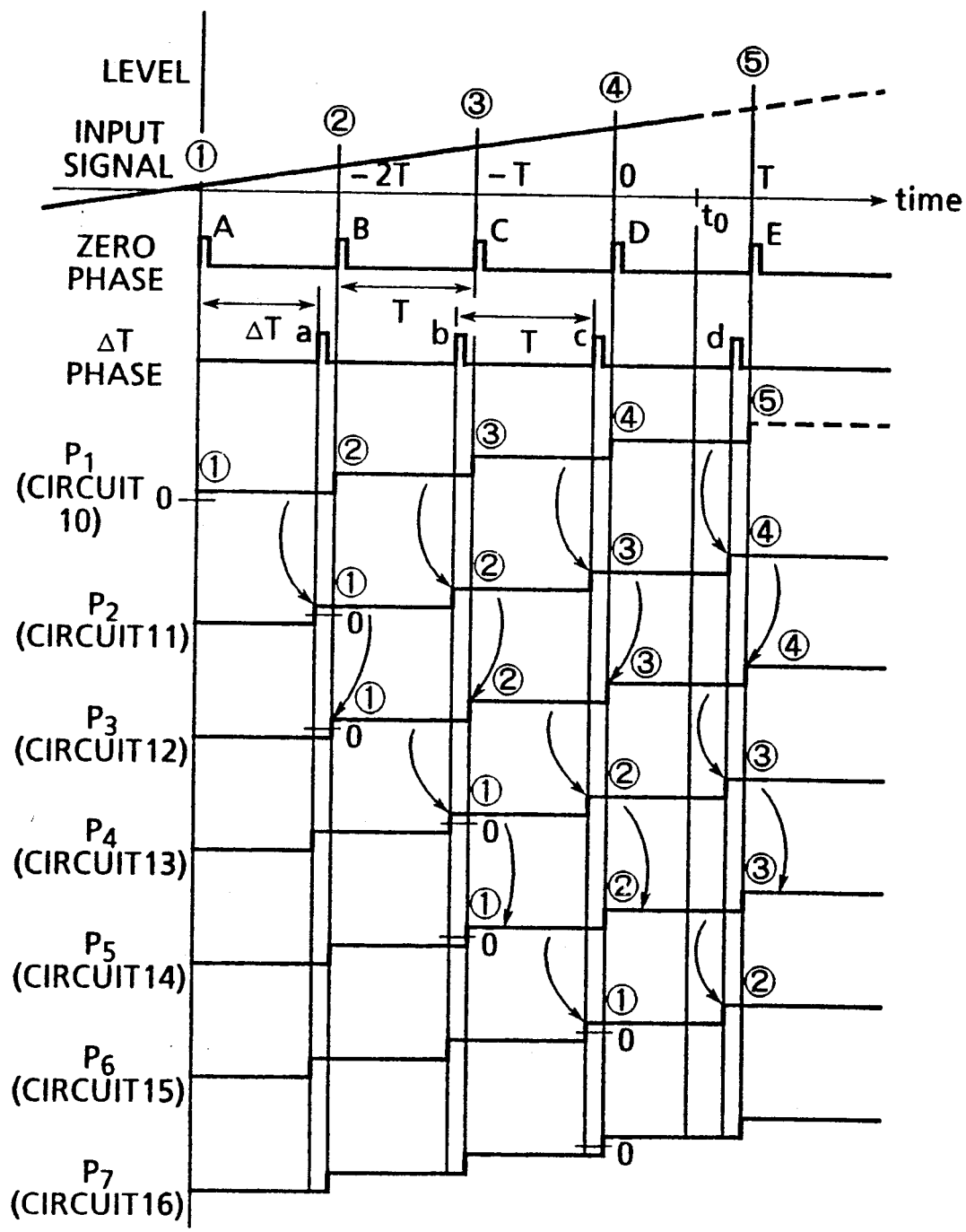
FIG. 4 is a timing chart of a two-phase pulse train and signal held on sample-and-hold circuit used in the noise removing circuit in FIG. 3.

When pulse A of the zero-phase is outputted, the switch 101 is opened so that the signal level 1 in FIG. 4 is held across the capacitor 102. That is, the sample-and-hold circuit 10 holds signal level 1.

Then, the sample-and-hold circuit 11 is activated by pulse a of T-phase $\Delta T$ after pulse A so as to receive and hold the signal level 1 being held on the circuit 10. The sample-and-hold circuit 10 is activated by pulse B to sample and hold signal level 2. The sample-hold circuit 12 is also activated by pulse B so as to receive and hold the signal level 1 held by the circuit 11.

The sample-and-hold circuit 11 is activated by pulse b of $\Delta T$-phase so as to receive and hold the signal level 2 held on the circuit 10. The sample-and-hold circuit 13 is also activated by pulse b so as to receive and hold the signal level 1 held by the circuit 12. The sample-and-hold circuit 10 is activated by pulse C of the zero-phase to sample and hold signal level 3. The sample-and-hold circuit 12 is also activated by pulse C to receive and hold the signal level 2 held by the circuit 11. The sample-and-hold circuit 14 is activated by pulse C to receive and hold the signal level 1 held by the circuit 13.

The sample-and-hold circuit 11 is activated by pulse c of $\Delta T$-phase pulse so as to receive and hold the signal level 3 held by the circuit 10. The sample-and-hold circuit 13 is also activated by pulse c so as to receive and hold the signal level 2 held by the circuit 12. The sample-hold circuit 15 is activated by pulse c so as to receive and hold the signal level 1 held by the circuit 14. The sample-and-hold circuit 10 is activated by pulse D of the zero-phase to sample and hold signal level 4. The sample-and-hold circuit 12 is activated by pulse D so as to receive and hold the signal level 3 held by the circuit 11. The sample-and-hold circuit 14 is activated by pulse D to receive and hold the signal level 2 held by the circuit 13. Then, the adder outputs a signal level P7 equal to signal level 1.

The sample-and-hold circuit 11 is activated by pulse d of $\Delta T$-phase so as to receive and hold the signal level 4 held by the circuit 10. The sample-and-hold circuits 13 is also activated by pulse d so as to receive and hold the signal level 3 held by the circuit 12. The sample-and-hold circuit 15 is activated by pulse d so as to receive and hold the signal level 2 held by the circuit 14. The sample-and-hold circuit 10 is activated by pulse E of the zero-phase to sample and hold signal level 5. The sample-and-hold circuit 12 is activated by pulse E to receive and hold the signal level 4 held by the circuit 11. The sample-and-hold circuit 14 is activated by pulse E to receive and hold the signal level 3 held by the circuit 13. Then, the adder outputs a signal level P7 equal to signal level 2.

By iterating the aforementioned operation, just before an impulse noise is detected at time $t=t_o$, the sample-and-hold circuit 11 holds the signal level (P2) sampled by a previous pulse (pulse D) of zero phase, and similarly the circuit 13 holds the signal level (P3) sampled two pulses before (pulse C) and the circuit 15 holds the signal level (P4) sampled three pulses before (pulse B.)

Figure 6:
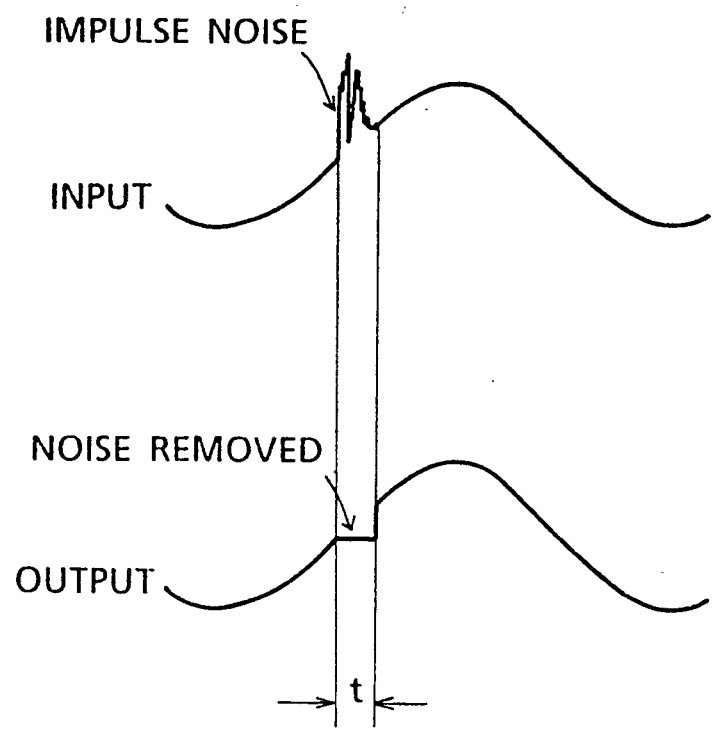
FIG. 6 shows the change in waveform of an input signal passing through a prior art noise removing circuit in FIG. 7.
Figure 7:
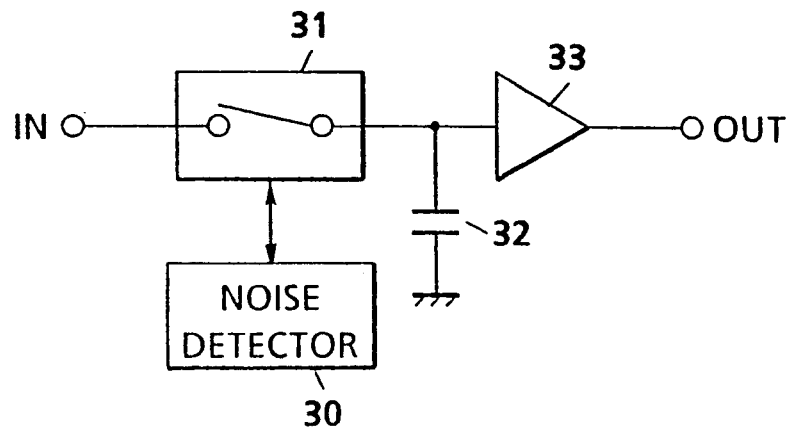
FIG. 7 shows a general construction of a prior art noise removing circuit for removing impulse noise from an input signal.

The extrapolation of signal level in the second embodiment will now be described as follows: As shown in FIGS. 5 and 6, if impulse noise is detected at time $t=t_o$, then the sample-and-hold circuits 11, 13, 15 holds the signal levels P2, P4, and P6 sampled by the sample-andhold circuit 10 at times t=0, t=−T, and t=−2T, respectively.

Assuming that the signal level varies according to a first order function, a signal level (P7) at t=T is extrapolated by the following equation.

$$P7 = a \cdot t + b \quad (11)$$

thus we have $$P7 = P2 + (P2 - P4) \quad (12)$$
$$= 2P2 - P4$$

Therefore, the multiplier 20 is given a coefficient of 2 so that the multiplier 20 outputs a signal level having a magnitude twice as large as that of the signal level P2 held by the sample-and-hold circuit 11. Likewise, the multiplier 21 is assigned a coefficient of −1 so that the multiplier 21 outputs a signal level having the same magnitude as and a polarity opposite to the signal P4 held by the sample-and-hold circuit 13. The multiplier 22 is given a coefficient of 0(zero) so that the output of the multiplier 22 is attenuated by an infinitely large coefficient. The adder 23 adds up the outputs of all the multipliers 20-21 to produce a signal level P7, which in turn is outputted from the adder 23 at time t=T as a signal level extrapolated from P2 at t=0 and P4 at t=−T. It should be noted that the signal level P7 is a future signal level extrapolated from both the signal levels P2 and P4 just before an impulse noise has been detected.

Assuming that the signal varies in amplitude with respect to a second order function, a signal level (P7) at t=T is extrapolated by the following equation.

$$P7 = a \cdot t^2 + b \cdot t + c \quad (13)$$

thus we obtain the following relation by putting P2 at t=0, P4 at t=−T, and P6 at t=−2T into equation (13).

$$P7 = P6 + 3(P2 - P4) \quad (14)$$

Thus, the multipliers 20, 21, and 22 are given coefficients 3, −3, and 1, respectively.

The thus produced signal level P7 is directed to the input selector switch 19. When the noise detector 18 detects an impulse noise in the input signal, the noise detector 18 causes the switch 19 to shift to position B during detection of impulse noise so as to direct the signal level P7 to the sample-and-hold circuit 10. In this manner, signal extrapolation is performed. The waveforms various stages of the noise removing circuit are similar to those in FIGS. 5A–5F.

The second embodiment has been described in terms of input signals of a first order function and a second order function, but various ways of producing extrapolated signal levels are possible by assigning the respective multipliers with appropriate coefficients. Although the second embodiment has been described with respect to six cascaded sample-and-hold circuits, four cascaded circuits are enough if only a first order extrapolation is needed.

What is claimed is:

1. A noise removing circuit for removing impulse noise in an analog signal, comprising:
    means for detecting impulse noise in an input analog signal;
    an input selector switch receiving as inputs said input analog signal and a second signal, said input selector outputting said input analog signal when said detecting means does not detect impulse noise in said input analog signal, and said input selector outputting said second signal when impulse noise is detected by said detecting means in said input analog signal;
    a polyphase sampling pulse generator for outputting polyphase pulse trains;
    a plurality of sample-and-hold circuits in cascaded connection for sampling and holding an output of said input selector switch, said sample-and-hold circuits being activated by pulses of a corresponding phase of said polyphase pulse trains to sample and hold a signal level being held on said output of said input selector switch and a preceding sample-and-hold circuit, an output of said noise removing circuit being provided at an output of a last one of said sample-and-hold circuits in said cascaded connection;
    a plurality of multipliers each having a predetermined multiplication coefficient, each of said multipliers outputting a signal level on a corresponding one of said sample-and-hold circuits multiplied by said predetermined coefficient; and
    an adder for adding outputs of said plurality of multipliers to produce said second signal.

2. A noise removing circuit according to claim 1, wherein a number of said plurality of sample-and-hold circuits is N where N≧2, and said polyphase pulse trains include N phases.

3. A noise removing circuit according to claim 1, wherein a number of said plurality of sample-and-hold circuits is 2N where N≧2, and said polyphase pulse trains include a first phase for activating odd-stage sample-and-hold circuits and a second phase for activating even-stage sample-and-hold circuits.

* * * * *